United States Patent [19]
Yamaguchi

[11] Patent Number: 5,670,819
[45] Date of Patent: Sep. 23, 1997

[54] SEMICONDUCTOR DEVICE WITH PAD ELECTRODE

[75] Inventor: Hisao Yamaguchi, Yokohama, Japan

[73] Assignee: Kabushiki Kaisha Toshiba, Kawasaki, Japan

[21] Appl. No.: 589,572

[22] Filed: Jan. 22, 1996

Related U.S. Application Data

[63] Continuation of Ser. No. 340,387, Nov. 15, 1994, abandoned.

[30] Foreign Application Priority Data

Nov. 15, 1993 [JP] Japan .................. 5-284775

[51] Int. Cl.$^6$ ............................................. H01L 29/00
[52] U.S. Cl. ..................... 257/536; 257/532; 257/538; 257/544
[58] Field of Search ................... 257/536, 537, 257/538, 541, 542, 543, 544, 552, 352, 359, 363, 362, 361

[56] References Cited

U.S. PATENT DOCUMENTS

| | | |
|---|---|---|
| 4,578,695 | 3/1986 | Delaporte et al. .............. 257/533 |
| 4,984,031 | 1/1991 | Rinderle ........................ 257/536 |

FOREIGN PATENT DOCUMENTS

| | | | |
|---|---|---|---|
| 63-136658 | 6/1988 | Japan | .................. 257/541 |
| 1-235266 | 9/1989 | Japan | .................. 257/537 |

OTHER PUBLICATIONS

"IBM Technical Disclosure Bulletin"; Ning; vol. 23, No.1 Jun. 1980; pp. 368-370.

*Primary Examiner*—Wael Fahmy
*Attorney, Agent, or Firm*—Oblon, Spivak, McClelland, Maier & Neustadt, P.C.

[57] ABSTRACT

An N$^-$-type epitaxial layer is formed on a P-type semiconductor substrate. A P-type region is formed in the N$^-$-type epitaxial layer. First and second N$^-$-type layer islands, isolated by the P-type region, are formed in the N$^-$-type epitaxial layer. An N$^+$-type contact region is formed in a surface region of the first N$^-$-type layer island. A pad electrode is formed above the first N$^-$-type layer island with an oxide film interposed therebetween. A polysilicon layer serving as a resistor is formed above the second N$^-$-type layer island with the oxide film interposed therebetween. A first conductive layer for electrically connecting the polysilicon layer with the N$^+$-type contact region is formed on the polysilicon layer, the N$^+$-type contact region and the oxide film. A second conductive layer for electrically connecting the polysilicon layer with a stable high-potential power source is formed on the oxide film and the polysilicon layer.

11 Claims, 5 Drawing Sheets

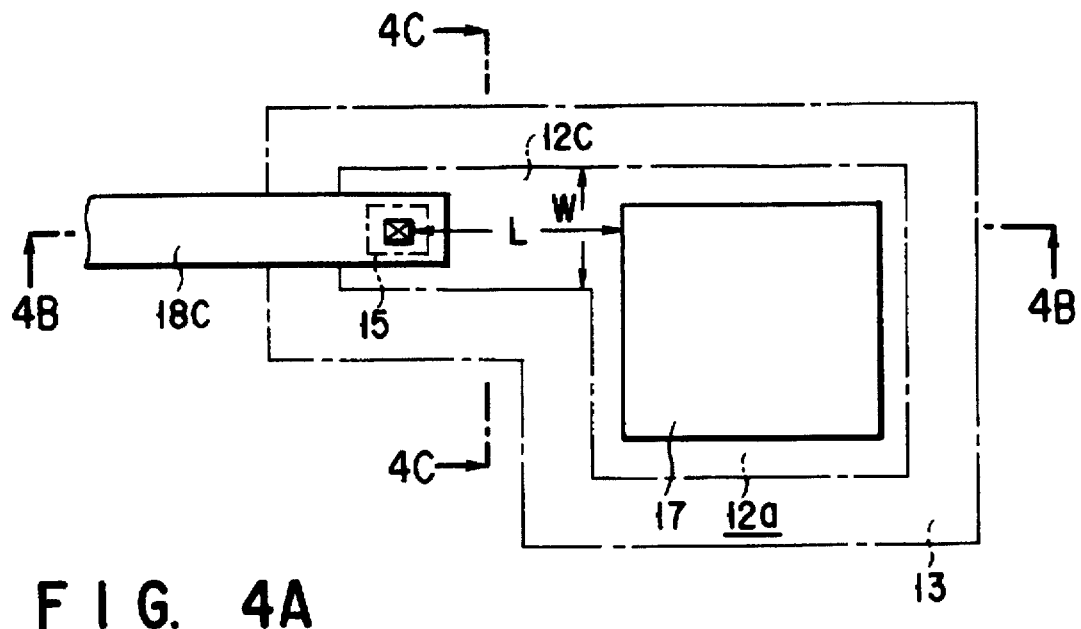
F I G. 4A
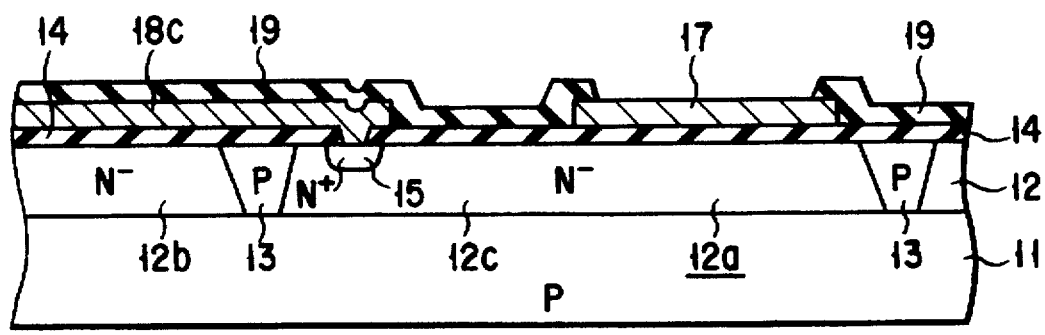
F I G. 4B
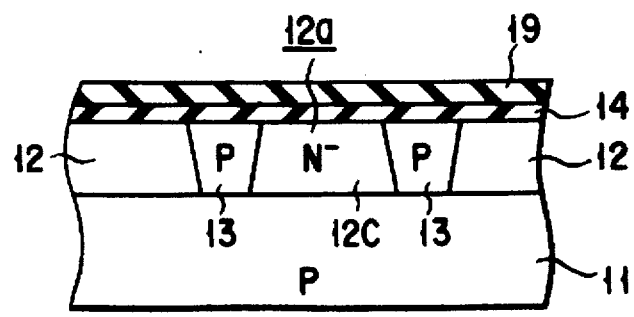
F I G. 4C

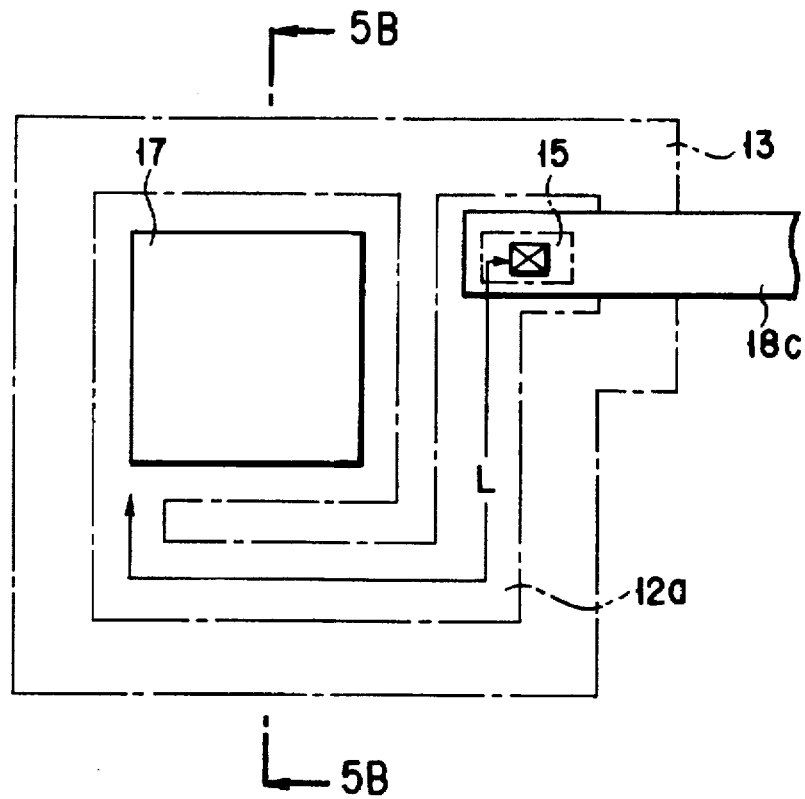
F I G. 5A
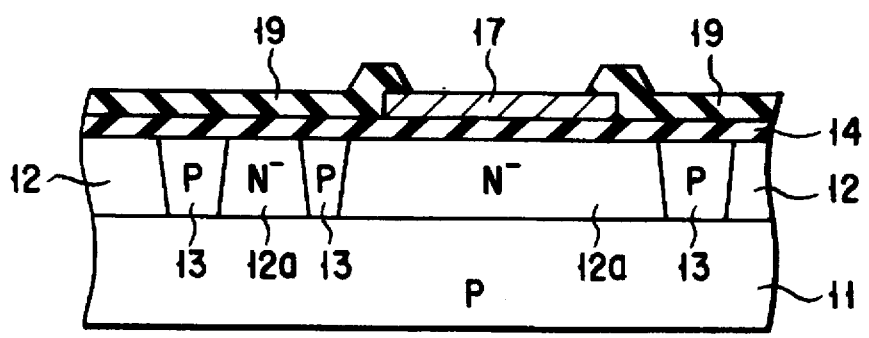
F I G. 5B

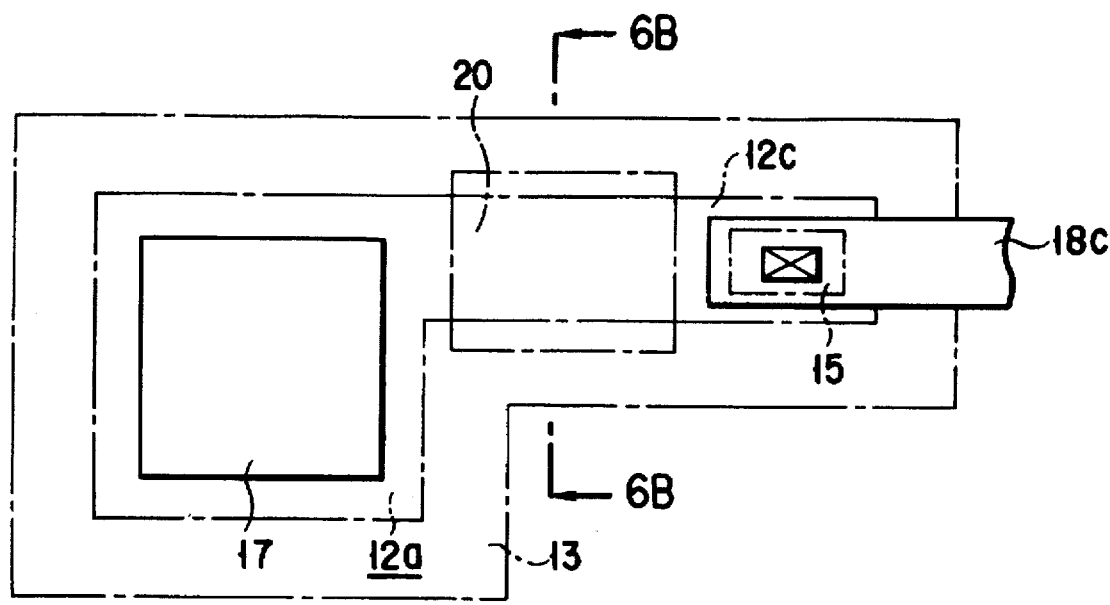
F I G. 6A
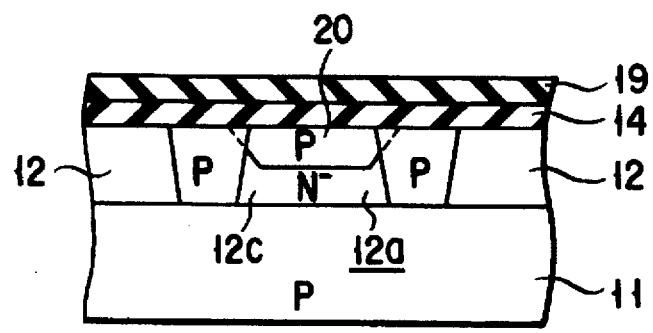
F I G. 6B

SEMICONDUCTOR DEVICE WITH PAD ELECTRODE

This application is a continuation of application Ser. No. 08/340,387, filed on Nov. 15, 1994, now abandoned.

BACKGROUND OF THE INVENTION

1. Field of the Invention

The present invention relates generally to a pad electrode of a semiconductor device, and more particularly to a pad electrode of a semiconductor device used in a high-frequency band.

2. Description of the Related Art

A semiconductor device in a TV or VTR is used in a high-frequency band. Such a semiconductor device and an external circuit (e.g., a resonance circuit or a tuning circuit) may constitute a circuit having a high capacitor sensitivity. The semiconductor device is electrically connected to the external circuit via at least a pad electrode provided in the semiconductor device. The capacitor sensitivity is greatly influenced by the structure of the pad electrode.

FIG. 1A is a cross-sectional view showing a pad electrode structure of the conventional semiconductor device. FIG. 1B is a diagram showing an equivalent circuit of the structure shown in FIG. 1A. As shown in FIG. 1A, an oxide film 102 is formed on a P-type semiconductor substrate 101. A pad electrode 103 is formed on the oxide film 102. An upper peripheral portion and sides of the pad electrode 103 are covered by a surface protecting film 104. In this structure, as shown in FIG. 1B, the pad electrode 103 is connected to the P-type semiconductor substrate 101 via a MOS capacitance ($C_{MOS}$). For this reason, the conventional pad structure is disadvantageous in that a change in potential of the P-type semiconductor substrate 101 may be transmitted to the pad electrode 103 via the MOS capacitance.

FIG. 2A is a cross-sectional view showing another pad electrode structure of the conventional semiconductor device. FIG. 2B is a diagram showing an equivalent circuit of the structure shown in FIG. 2A. As shown in FIG. 2A, an N$^-$-type epitaxial layer 105 is formed on a P-type semiconductor substrate 101. An N$^-$-type isolation region (pocket) 105a isolated by a P-type region 106 is formed in the N$^-$-type epitaxial layer 105. A pad electrode 103 is formed above the N$^-$-type isolation region 105a with an oxide film 102 interposed therebetween. In this structure, as shown in FIG. 2B, the pad electrode 103 is connected to the P-type semiconductor substrate 101 via a MOS capacitance ($C_{MOS}$) and a junction capacitance ($C_J$) formed by a PN junction. The pad electrode 103 is less influenced by a change in potential of the P-type semiconductor substrate 101, as compared to the structure shown in FIGS. 1A and 1B. The capacitance $C_J$ is increased as time passes, since a very little leak current flows through the PN junction. As a result, the potential of the N$^-$-type isolation region 105a gradually lowers. For this reason, when a signal (potential V) is input to the pad electrode 103, a tuning drift (SW ON drift) occurs in the pad electrode 103 due to the time-sequential change of $C_J$, with the result that a shock sound is generated at a power-on time. When the semiconductor is used in a high-frequency band, the time-sequential change of $C_J$ in the pad electrode 103 causes degradation of the characteristics of the semiconductor.

SUMMARY OF THE INVENTION

An object of the present invention is to provide a semiconductor device in which the time-sequential change in a parasitic capacitance of a pad electrode is eliminated and generation of a shock sound is prevented at a power-on time.

The above object can be achieved by a semiconductor device comprising:

a semiconductor substrate of a first conductivity type;

an epitaxial layer of a second conductivity type formed on a surface of the semiconductor substrate;

a region of the second conductivity type formed in the epitaxial layer;

a semiconductor layer of the first conductivity type, formed in the epitaxial layer, for isolating the region of the second conductivity type from another region in the epitaxial layer;

an insulating film formed on the epitaxial layer;

a pad electrode formed on the insulating film and located above the region of the second conductivity type; and a maintaining means for maintaining the region of the second conductivity type at a constant potential.

In the above semiconductor device, the parasitic capacitance of the pad electrode is composed of a MOS capacitance between the pad electrode and the region of the second conductivity type and a junction capacitance between the region of the second conductivity type and the semiconductor substrate. The potential of the region of the second conductivity type is kept constant by the maintaining means. Hence, the time-sequential change in the parasitic capacitance of the pad electrode is eliminated. As a result, a tuning drift (SW ON drift) at a power-on time is prevented, thereby preventing generation of a shock sound at the power-on time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a plan view showing a semiconductor device according to a second embodiment of the present invention;

FIG. 4B is a cross-sectional view of the semiconductor device shown in FIG. 4A taken along the line 4B—4B;

FIG. 4C is a cross-sectional view of the semiconductor device shown in FIG. 4A taken along the line 4C—4C;

FIG. 5A is a plan view showing a semiconductor device according to a third embodiment of the present invention;

FIG. 5B is a cross-sectional view of the semiconductor device shown in FIG. 5A taken along the line 5B—5B;

FIG. 6A is a plan view showing a semiconductor device according to a fourth embodiment of the present invention; and FIG. 6B is a cross-sectional view of the semiconductor device shown in FIG. 6A taken along the line 6B—6B.

DETAILED DESCRIPTION OF THE PREFERRRED EMBODIMENTS

Embodiments of the present invention will be described with reference to the accompanying drawings.

Figure 1A:
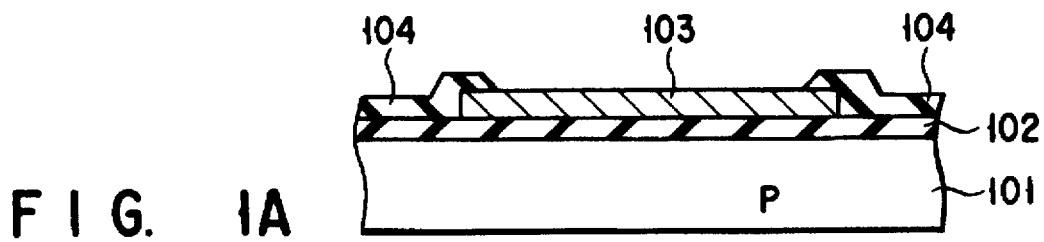
FIG. 1A is a cross-sectional view showing a pad electrode structure of the conventional semiconductor device.
Figure 1B:
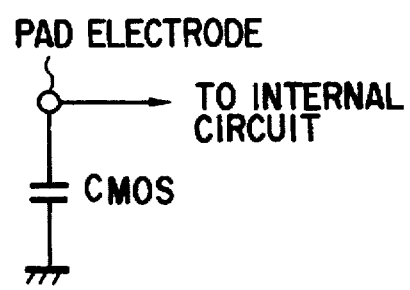
FIG. 1B is a diagram showing an equivalent circuit of the structure shown in FIG. 1A.
Figure 2A:
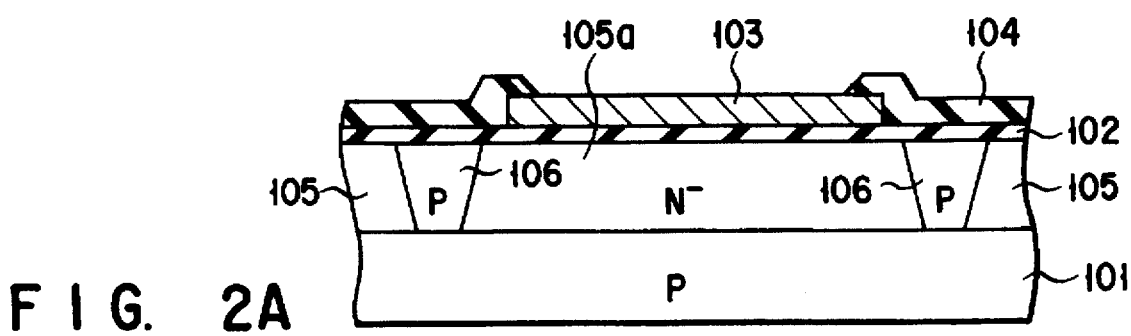
FIG. 2A is a cross-sectional view showing another pad electrode structure of the conventional semiconductor device.
Figure 2B:
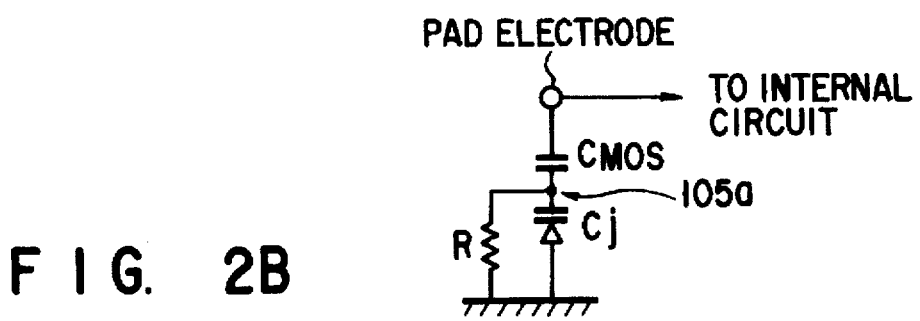
FIG. 2B is a diagram showing an equivalent circuit of the structure shown in FIG. 2A.
Figure 3A:
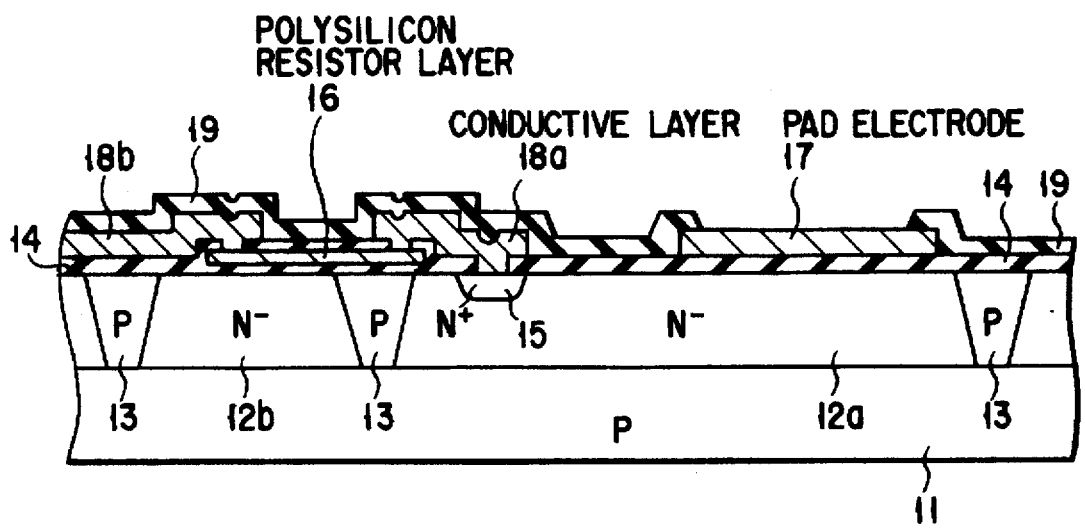
FIG. 3A is a cross-sectional view showing a semiconductor device according to a first embodiment of the present invention.
Figure 3B:
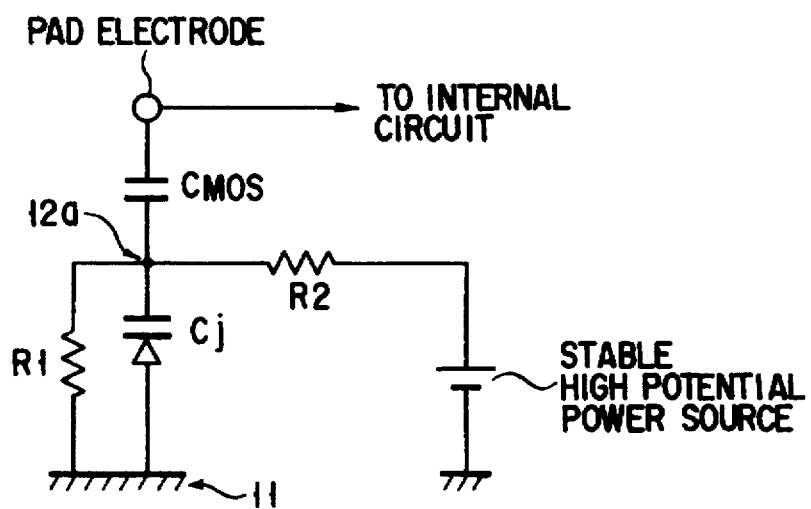
FIG. 3B is a diagram showing an equivalent circuit of the semiconductor device shown in FIG. 3A.

FIG. 3A is a cross-sectional view showing a semiconductor device according to a first embodiment of the present invention and FIG. 3B is a diagram showing an equivalent circuit of the semiconductor device shown in FIG. 3A. An $N^-$ epitaxial layer 12 is formed on a surface of a P-type semiconductor substrate (P-type Si substrate) 11. A P-type region 13 is formed in the $N^-$ epitaxial layer 12. First and second $N^-$-type isolation regions (pockets) 12a and 12b are formed by element-isolating the $N^-$ epitaxial layer 12 with the P-type region 13. An $N^+$ contact region 15 is formed in a surface region of the first isolation region 12a.

Oxide films 14, made of stable dielectric material, are formed on the first and second $N^-$-type isolation regions 12a and 12b. On the oxide film 14, a pad electrode 17 is formed above the first $N^-$-type isolation region 12a. A polysilicon layer 16, serving as a resistor, is formed above the second $N^-$-type isolation region 12b in the oxide film 14. A first conductive layer 18a made of, for example, Al, is formed on the polysilicon layer 16, the oxide film 14 and the $N^+$ contact region 15. One end of the first conductive layer 18a is electrically connected to the $N^+$ contact region 15 and the other end thereof is electrically connected to the polysilicon layer 16.

A second conductive layer 18b made of, for example, Al, is formed on the oxide film 14 and the polysilicon layer 16. One end of the second conductive layer 18b is electrically connected to the polysilicon layer 16 and the other end thereof is connected to a stable high potential, for example, $V_{CC}$ (not shown).

A surface protecting film 19 is formed on the first and second conductive layers 18a and 18b, the polysilicon layer 16 and the oxide film 14, and sides and upper peripheral portions of the pad electrode 17. The surface protecting film 19 has an opening, through which the surface of the pad electrode 17 is exposed. An equivalent circuit of the semiconductor device as described above is shown in FIG. 3B. The pad electrode 17 is connected to the semiconductor substrate 11 via a MOS capacitance ($C_{MOS}$) and a junction capacitance ($C_J$) formed by a PN junction. The potential of the first $N^-$-type isolation region 12a is determined by a resistor $R_1$ due to a very small leak current generated in the PN junction in the first $N^-$-type isolation region 12a, a resistor $R_2$, i.e., the resistance of the polysilicon layer 16, and the stable high potential power source.

For example, assuming that the first $N^-$-type isolation region 12a is not connected to the resistor $R_2$ or the stable high potential power source, the composed parasitic capacitance C in the pad electrode 17 is $(C_{MOS} \times C_J)/(C_{MOS}+C_J)$. In this case, since $C_J$ changes due to a voltage drop in the resistor $R_1$, the composed parasitic capacitance C also changes. For this reason, when a signal is input, i.e., a potential V is applied, to the pad electrode 17, a tuning frequency in the pad electrode 17 is changed. As a result, a shock sound is generated at a power-on time. However, according to the present invention, since the first $N^-$-type isolation region 12a is connected to the stable high potential power source via the resistor $R_2$, the potential of the first $N^-$-type isolation region 12a can be stable. More specifically, although the potential of the first $N^-$-type isolation region 12a is lowered due to a voltage drop in the resistor $R_1$, the isolation region 12a is immediately charged by the high potential power source through the resistor $R_2$, with the result that the potential can be kept substantially constant. The charge of the isolation region 12a is achieved within a very short period of time of 50 μsec, corresponding to 20 KHz, i.e., the maximum frequency (audible frequency) which a man can hear by the auditory sense.

Therefore, since the composed parasitic capacitance C of the pad electrode 17 is substantially stable, when the potential V is applied to the pad electrode 17, a shock sound at the power-on time can be prevented. In other words, although the composed parasitic capacitance C may change, the period of change is within 50 μsec. Therefore, even if a shock sound is generated at the power-on time, a man cannot sense the sound.

The resistor $R_2$ has a resistance value great enough to attenuate ripples transmitted from the high-potential power source. The resistance value is higher than the impedance of the $C_{MOS}$ of the pad electrode 17 in the used frequency. More specifically, it is desirable that the resistance of the resistor $R_2$ be 20 KΩ to 1 MΩ. In this manner, owing to the resistor $R_2$, the pad electrode 17 is prevented from interference of the high potential power source. FIG. 4A is a plan view showing a semiconductor device according to a second embodiment of the present invention. FIG. 4B is a cross-sectional view of the semiconductor device shown in FIG. 4A taken along the line 4B—4B and FIG. 4C is a cross-sectional view of the semiconductor device shown in FIG. 4A taken along the line 4C—4C. In FIGS. 4A to 4C, the same elements as shown in FIGS. 3A and 3B are identified with the same reference numerals as used in FIGS. 3A and 3B. The elements different from those in the first embodiment will be described below.

In the second embodiment, an epitaxial resistor is used as the resistor $R_2$ shown in FIG. 3B. As shown in FIG. 4A, a projecting portion 12c of the first $N^-$-type isolation region 12a is used as the epitaxial resistor. The projecting portion 12c has a length L and a width W as indicated in FIG. 4A.

The first $N^-$-type isolation region 12a is connected to a conductive layer 18c, made of, for example, Al, which is connected to the stable high potential power source as shown in FIG. 3B.

An epitaxial resistance is R is obtained by the equation:

$$R = \rho_S \times L/W,$$

where ρs is a sheet resistance. The sheet resistance ρs is within a range of 2 to 5 KΩ/□ (5 kilo-ohms per square). If the width W is as small as possible to the technical limit, the length L must be as long as possible in order to obtain a high epitaxial resistance R.

In the second embodiment, the same effect as in the first embodiment can be obtained.

FIG. 5A is a plan view showing a semiconductor device according to a third embodiment of the present invention and FIG. 5B is a cross-sectional view of the semiconductor device shown in FIG. 5A taken along the line 5B—5B. In FIGS. 5A and 5B, the same elements as shown in FIGS. 4A to 4C are identified with the same reference numerals as used in FIGS. 4A to 4C. The elements different from those in the second embodiment will be described below.

As clearly shown in FIG. 5A, part of the first N⁻-type isolation region 12a, serving as an epitaxial resistor, is arranged around the pad electrode 17. Accordingly, the length L of the epitaxial resistor can be sufficiently long. Since, in general, no element is formed around the pad electrode, the length L can be prolonged easily.

In the third embodiment, the same effect as in the second embodiment can be obtained.

FIG. 6A is a plan view showing a semiconductor device according to a fourth embodiment of the present invention and FIG. 6B is a cross-sectional view of the semiconductor device shown in FIG. 6A taken along the line 6B—6B. In FIGS. 6A and 6B, the same elements as shown in FIGS. 4A to 4C are identified with the same reference numerals as used in FIGS. 4A to 4C. The elements different from those in the second embodiment will be described below.

In the fourth embodiment, an epitaxial pinch resistor is used as the resistor $R_2$ shown in FIG. 3B. As shown in FIG. 6A, a P-type diffusion layer 20 is formed on the projecting portion 12c of the first N⁻-type isolation region 12a. More specifically, as shown in FIG. 6B, the diffusion layer 20 is formed in a surface region of the projecting portion 12c.

The epitaxial pinch resistor has a sheet resistance ρs in a range of 4 to 10 KΩ/□(4 to 10 kilo-ohms per square), which is higher than the epitaxial resistor. It is therefore unnecessary to prolong the length L, unlike in the case using the epitaxial resistor as shown in FIG. 4A. Thus, a high resistance can be obtained easily at a low cost.

In the fourth embodiment, the same effect as in the second embodiment can be obtained.

Needless to say, it is only necessary that the pad electrode structure according to the first to fourth embodiments be applied to a pad electrode connected to an external circuit (e.g., a resonance circuit or a tuning circuit), which forms a high-capacitor sensitivity circuit.

According to the first to fourth embodiments, even if the potential of the first N⁻-type isolation region 12a is lowered due to a voltage drop in the resistor $R_1$, the isolation region 12a can be immediately charged by the high potential power source through the resistor $R_2$, within a very short period of time corresponding to the maximum frequency (audible frequency) which a man can hear by the auditory sense. The time-sequential change in the parasitic capacitance of the pad electrode 17 is thus eliminated. As a result, a shock sound, when a signal is input to the pad electrode 17, is prevented. Consequently, even when the semiconductor device is used in a high-frequency band, the characteristics of the device are not degraded.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

an epitaxial layer of a second conductivity type formed on a surface of the semiconductor substrate, said epitaxial layer including first and second regions;

a semiconductor layer of the first conductivity type, formed in the epitaxial layer, for isolating the first region from the second region, said first region including a first resistance, a relatively strongly doped second conductivity layer and a relatively weakly doped second conductivity layer;

an insulating film formed on the epitaxial layer;

a bonding pad electrode formed on the insulating film and located above the first region and above said weakly doped second conductivity layer, said bonding pad electrode and said first region forming a capacitor using said insulating film as an insulator; and a resistor layer, formed on the insulating film and located above the second region, one end of the resistor layer being connected to said strongly doped second conductivity layer in the first region through said insulating film and another end of the resistor layer being connected to a power source.

2. The semiconductor device according to claim 1, wherein the resister is a polysilicon layer formed on the insulating film.

3. The semiconductor device according to claim 1, wherein the resistor has a resistance value great enough to attenuate ripples transmitted from the power source.

4. A semiconductor device comprising:

a semiconductor substrate of a first conductivity type;

an epitaxial layer of a second conductivity type formed on a surface of the semiconductor substrate, said epitaxial layer including first and second regions;

a semiconductor layer of the first conductivity type, formed in the epitaxial layer, for isolating the first region from the second region, said first region including a first resistance;

an insulating film formed on the epitaxial layer;

a pad electrode formed on the insulating film and located above the first region; and a resistor layer, formed on the insulating film and located above the second region, one end of the resistor layer being connected to the first region through said insulating film and another end of the resistor layer being connected to a power source, wherein the resistor has a resistance value great enough to attenuate ripples transmitted from the power source, and wherein the resistance value is greater than an impedance of a capacitor formed by the pad electrode, the insulating film and the first region.

5. The semiconductor device according to claim 4, wherein the resistance value is 20 KΩ to 1 MΩ.

6. A semiconductor device comprising:

a semiconductor substrate of a first conductivity type;

an epitaxial layer of a second conductivity type formed on a surface of the semiconductor substrate, said epitaxial layer including first and second regions, said first region being a uniformly doped second conductivity layer; said second region of said epitaxial layer serving as an epitaxial resistor;

an insulating film formed on the epitaxial layer; and a power source electrically connected to the second region of the epitaxial layer through said insulating film; and a bonding pad electrode formed on the insulating film and located above the first region of said epitaxial layer, said bonding pad electrode and said first region forming a capacitor using said insulating film as an insulator.

7. The semiconductor device according to claim 6, wherein the second region of the epitaxial layer serving as the epitaxial resistor has a resistance value great enough to attenuate ripples transmitted from the power source.

8. A semiconductor device comprising:

a semiconductor substrate of a first conductivity type;

an epitaxial layer of a second conductivity type formed on a surface of the semiconductor substrate, said epitaxial layer including first and second regions, said second region of said epitaxial layer serving as an epitaxial resistor;

an insulating film formed on the epitaxial layer;

a power source electrically connected to the second region of the epitaxial layer through said insulating film;

a pad electrode formed on the insulating film and located above the first region of said epitaxial layer;

wherein the second region of the epitaxial layer serving as the epitaxial resistor has a resistance value great enough to attenuate ripples transmitted from the power source, and wherein the resistance value is greater than an impedance of a capacitor formed by the pad electrode, the insulating film and the first region of the epitaxial layer.

9. The semiconductor device according to claim 6, wherein the second region of the epitaxial layer serving as the epitaxial resistor is arranged around the bonding pad electrode.

10. The semiconductor device according to claim 6, wherein a region of the first conductivity type is formed in the second region of the epitaxial layer in that an epitaxial pinch resistor is formed.

11. A semiconductor device comprising:

a semiconductor substrate of a first conductivity type;

an epitaxial layer of a second conductivity type formed on a surface of the semiconductor substrate, said epitaxial layer including first and second regions, said second region of said epitaxial layer serving as an epitaxial resistor;

an insulating film formed on the epitaxial layer;

a power source electrically connected to the second region of the epitaxial layer through said insulating film;

a pad electrode formed on the insulating film and located above the first region of said epitaxial layer, and wherein a width of the second region of the epitaxial layer is set narrower than that of the first region of the epitaxial layer.

* * * * *